United States Patent
Sato et al.

(10) Patent No.: US 6,990,013 B2
(45) Date of Patent: Jan. 24, 2006

(54) MAGNETIC MEMORY, AND METHOD FOR WRITING THE SAME

(75) Inventors: Rie Sato, Kanagawa (JP); Koichi Mizushima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 21 days.

(21) Appl. No.: 10/808,404

(22) Filed: Mar. 25, 2004

(65) Prior Publication Data
US 2004/0257863 A1    Dec. 23, 2004

(30) Foreign Application Priority Data
Mar. 28, 2003  (JP)  ............ P. 2003-092262

(51) Int. Cl.
*G11C 11/00* (2006.01)
(52) U.S. Cl. ..................... 365/158; 365/171
(58) Field of Classification Search ........... 365/158, 365/171, 173, 97, 66, 48
See application file for complete search history.

(56) References Cited

U.S. PATENT DOCUMENTS

| | | |
|---|---|---|
| 5,699,374 A | 12/1997 | Ichimura et al. |
| 5,898,720 A | 4/1999 | Yamamoto et al. |
| 6,480,412 B1 * | 11/2002 | Bessho et al. ............ 365/173 |
| 6,741,496 B2 * | 5/2004 | Hannah et al. ............ 365/173 |

OTHER PUBLICATIONS

J.C. Slonczewski, "Current Driven Excitation of Magnetic Multilayers", Journal of Magnetism and Magnetic Materials, 159, L-1-L-7, (Jun. 1996).
E.B. Myers et al., "Current-Induced Switching of Domains in Magnetic Multilayer Devices", Science, vol. 285, pp. 867-870, (Aug. 1999).

* cited by examiner

*Primary Examiner*—Gene N. Auduong
(74) *Attorney, Agent, or Firm*—Finnegan, Henderson, Farabow, Garrett & Dunner, L.L.P.

(57) ABSTRACT

A magnetic memory includes: a spin polarization unit configured to spin-polarize electrons constituting a write current; a hot electron generation unit configured to convert electrons constituting the write current into hot electrons; and a magnetic layer which is subjected to magnetization reversal by the write current that has been spin-polarized by the spin polarization unit and converted into hot electrons by the hot electron generation unit.

13 Claims, 13 Drawing Sheets

N  F₁  N  F₂

MAGNETIC MEMORY, AND METHOD FOR WRITING THE SAME

CROSS REFERENCE TO RELATED APPLICATIONS

This application is based upon and claims the benefit of priority from the prior Japanese Patent Application No. 2003-092262 filed on Mar. 28, 2003, the entire contents of which are incorporated herein by reference.

BACKGROUND OF THE INVENTION

The invention relates to a magnetic memory and a method for writing data on the magnetic memory.

A related-art magnetic recording medium acts as a magnetic disk or a file memory. Data of the magnetic recording medium are temporarily loaded in semiconductor memory (DRAM or SRAM) of a computer main body. The data are utilized later. Semiconductor memory, particularly DRAM, combines many superior characteristics, but has a drawback of consuming a large amount of power for maintaining memory contents.

Flash memory and FRAM (Ferroelectric Random Access Memory), which obviate a necessity for retaining memory contents, have recently been developed, and commercialization of the flash memory and the FRAM is pursued. However, both of these memory devices suffer from a drawback of a limited number of rewriting operations.

Solid magnetic memory (MRAM) is superior to these memory devices in that power is not required to maintain memory contents, and substantially no limitation is imposed on the number of rewriting operations. The solid magnetic memory (MRAM) is constituted of an aggregate of memory cells, each cell corresponding to one bit, as in the case of DRAM. Each cell is made up of a switching element, such as a MOS (metal-oxide semiconductor) transistor, and a magnetic element such as a magnetic tunnel junction element. Data are written into each related-art cell by means of reversing magnetization of the magnetic element through use of an external magnetic field. A specific method is to provide two wires, which intersect at right angles, in the vicinity of the magnetic element and to apply the external magnetic field to the magnetic element by causing an electric current to flow through the wires. Use of two wires enables selective magnetization reversal of the magnetic element provided in the vicinity of the intersection.

In addition to this technique, there is reported another technique for forming metal in micropores formed in an insulator, thereby controlling the directivity of an electric current, as disclosed in "E. B. Myers et al. Current-Induced Switching of Domains in Magnetic Multilayer Devices, SCIENCE VOL. 285 6, Aug., 1999". The technique is to insert a $Si_3N_4$ layer between Cu and Co in a Cu/Co/Cu/Co multilayer film and to form bowl-shaped micropores (each pore measures from 5 nanometers to 10 nanometers) in the $Si_3N_4$ layer, thereby imparting predetermined anisotropy to the electric current flowing through Cu in the micropores.

In the case of the related-art solid magnetic memory, magnetization of the magnetic element is controlled by application of a current magnetic field generated as a result of flow of an electric current into a wire. However, in the case of such a writing method, an electric current of certain magnitude must be caused to flow into the wire in order to generate a predetermined inverse magnetic field. Hence, the related-art solid magnetic memory encounters a problem of an increase in the amount of electric current consumed by the memory.

Further, if the scale of integration of memory has increased and an interval between the memory cells has decreased, there arises an increase in the frequency of occurrence of a "crosstalk" phenomenon, wherein magnetization of cells provided in the vicinity of a desired cell as well as magnetization of the desired cell are reversed. The reason for this is that an external magnetic field developing as a result of flow of an electric current through a wire has a spread. Difficulty is encountered in localizing the external magnetic field in only a desired element.

As mentioned above, a magnetic memory requires a large current to write data and also suffers a problem of occurrence of a "crosstalk" phenomenon between memory cells at the time of writing operation as a result of an increase in the scale of integration.

BRIEF SUMMARY OF THE INVENTION

The invention has been conceived to solve the problem and an object of the invention is to provide a magnetic memory capable of effecting writing operation with a small current and without involvement of crosstalk, as well as a method for writing data thereon.

In order to accomplish the object, according to a first aspect of the invention, there is provided a magnetic memory including: a spin polarization unit configured to spin-polarize electrons constituting a write current; a hot electron generation unit configured to convert electrons constituting the write current into hot electrons; and a magnetic layer which is subjected to magnetization reversal by the write current that has been spin-polarized by the spin polarization unit and converted into hot electrons by the hot electron generation unit.

According to the first aspect of the invention, therefore, a magnetic memory capable of writing data at a small current without involvement of crosstalk is provided.

Further, according to a second aspect of the invention, there is provided a method of writing data into a magnetic memory including: spin-polarizing the electrons constituting a write current; converting electrons constituting the write current into hot electrons; and reversing magnetization of a magnetic layer by the hot electrons.

According to the second aspect of the invention, therefore, a method for writing data on a magnetic memory capable of writing data at a small current without involvement of crosstalk is provided.

Further, according to a third aspect of the invention, there is provided a magnetic memory comprising: a first electrode; a first magnetic layer formed above the first electrode; a first non-magnetic layer formed on the first magnetic layer; a second magnetic layer formed on the first non-magnetic layer; a first insulation film formed on the second magnetic layer; a first layer formed on the first insulation film; a second non-magnetic layer formed on the first layer; and a second electrode formed on the second non-magnetic layer.

Besides, the term "tunnel insulation film" used herein designates a film whose voltage and current characteristics become non-linear when an electric current is caused to flow in a direction perpendicular to the film surface by application of a voltage. When a tunneling phenomenon does not arise, voltage/current characteristics become linear, whereby a so-called "ohmic characteristic" obtained, wherein voltage and current characteristics are become linear. In contrast, according to the embodiment, use of a tunnel insulation film whose voltage/current characteristics become non-linear, enables generation of hot electrons.

BRIEF DESCRIPTION OF THE DRAWINGS

These and other objects and advantages of this invention will become more fully apparent from the following detailed description taken with the accompanying drawings in which.

DETAILED DESCRIPTION OF THE INVENTION

Embodiments of the invention will be described hereinbelow by reference to the drawings.

Figure 1:
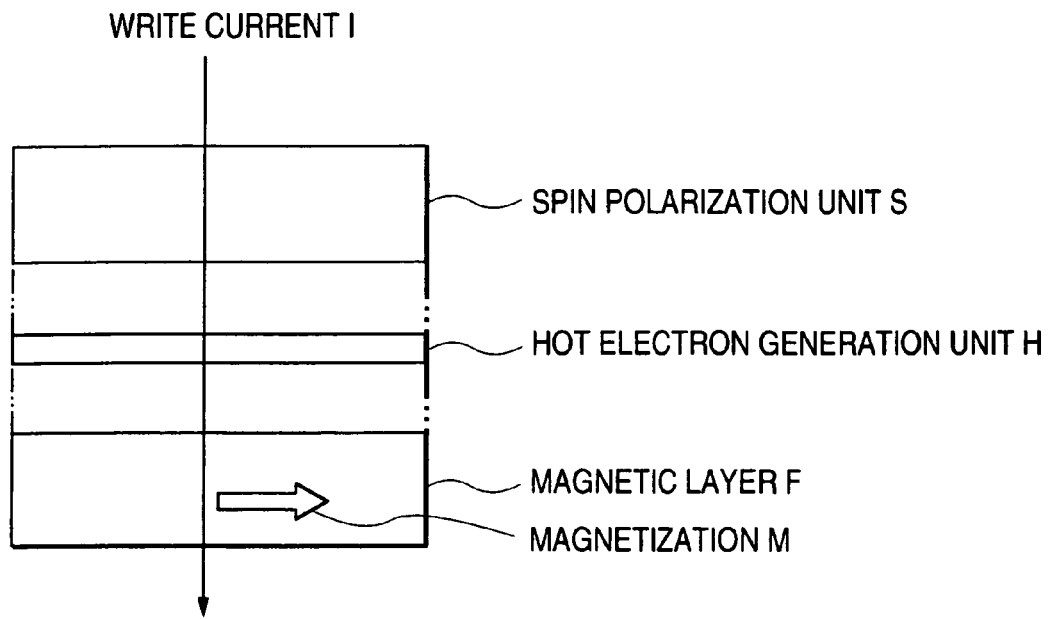
FIG. 1 is a schematic view showing a portion of a cell of magnetic memory according to an embodiment of the invention.

FIG. 1 is a schematic cross-sectional view showing a portion of a cell of magnetic memory according to an embodiment of the invention. The drawing shows a portion of a magnetic element included in a memory cell; that is, a basic structure including a spin polarization unit S, a hot electron generation unit H, and a magnetic layer F. In the embodiment, a write current I is caused to flow in the direction of the arrow (or in the direction opposite thereto), thereby enabling reversal of magnetization M of the magnetic layer F in a predetermined direction. Specifically, spin of the write current I is polarized in a predetermined direction by the spin polarization unit S. The write current I is converted into high-energy hot electrons by means of the hot electron generation unit H. Magnetization is written into the magnetic layer F by means of "spin injection". In this way, magnetization in a predetermined direction can be written into the magnetic layer F by use of a small write current without provision of an external magnetic field.

First, the term "spin injection" used for the magnetic memory of the invention will now be described. Spin injection is described in "J. Magn. Magn. Mater. 159, L1 (1996)".

Figure 2:
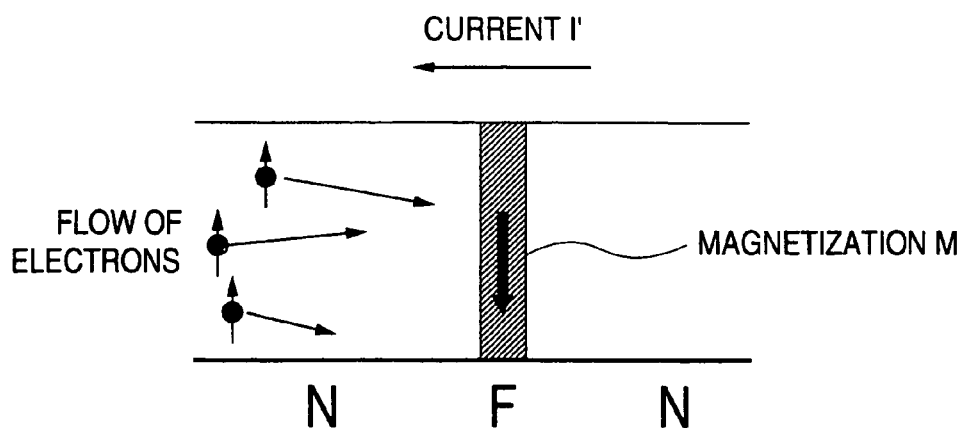
FIG. 2 is a conceptual rendering for describing the principle of spin injection.

FIG. 2 is a conceptual cross-sectional view for describing the principle of spin injection. For example, as illustrated, a spin-polarized current I' is caused to flow in a direction perpendicular to a film surface of a multilayer member formed from a non-magnetic layer N, a magnetic layer F, and a non-magnetic layer N. As a result, magnetization M of the magnetic layer F can be reversed by means of the spin-polarized electrons. The reason for this is that spin-polarized electrons possess angular momentum in the spinning direction, and the angular momentum exerts rotational force (torque) on the magnetization of the magnetic layer F.

In relation to the structure shown in FIG. 2, the magnitude of the force to be used for spinning the magnetization M of the magnetic layer F is determined by means of (1) the magnitude of a write current, (2) the degree of spin polarization of the write current, and (3) spin dependency of electron reflectivity achieved at a interface between the non-magnetic layer N/magnetic layer F. Further, the rotating direction of the magnetization M is determined by the direction of the write current. Specifically, when an electric current having a single magnitude and a single degree of spin polarization is caused to flow, the greater rotational force develops as the spin dependency of the electron reflectivity achieved at the interface (3) becomes greater, whereby the rotating direction is changed in accordance with the direction of the current.

Figure 3:
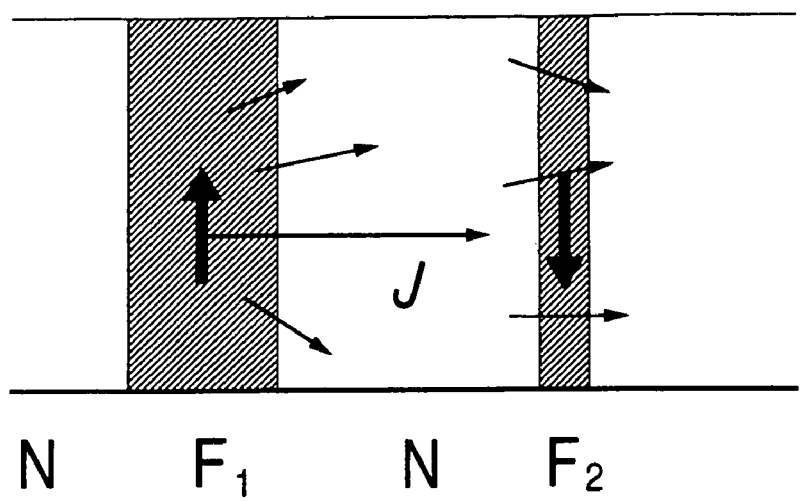
FIG. 3 is a schematic view showing a spin injection structure discussed during the process in which the present inventor has come to conceive the present invention.

FIG. 3 is a schematic cross-sectional view showing a spin injection structure discussed during the process in which the present inventor has come to conceive the present invention. Specifically, the drawing shows a portion of a magnetic element, wherein the non-magnetic layer N, a magnetic layer F1, the non-magnetic layer N, and a magnetic layer F2 are stacked, in this sequence.

The magnetic layer F1 is a thick magnetic layer possessing large coercive force, and the orientation of the magnetization M is fixed, whereby a spin-polarized electric current is produced.

The magnetic layer F2 is a thin magnetic layer possessing small coercive force. As a result of the electric current J that is spin-polarized by means of the magnetic layer F1 flowing through the magnetic layer F2, the magnetization M can be rotated.

Review of the spin injection structure shown in FIG. 3 by the present inventor revealed that when a magnetic substance such as cobalt (Co) is used as material of the magnetic layers F1, F2 and a non-magnetic substance such as copper (Cu) is used as a material of the non-magnetic layer N, magnetization reversal of the magnetic layer F2 turns out to require a considerably large current density on the order of about $10^8$ A/cm$^2$.

The principal reason why such a large current density is required is considered to be that the spin dependency of electron reflection achieved at the interface of the magnetic layers (F1, F2) /non-magnetic layer N is small. Specifically, in view of a material or structure, the spin dependency of interface reflection must be increased.

The spin dependency of interface reflection changes in accordance with the traveling direction and kinetic energy (or speed) of electrons. In the case of a structure of a comparative example shown in FIG. 3, conduction electrons situated above the Fermi surface; that is, electrons which possess Fermi energy and are to travel in various directions (as indicated by narrow arrows.), contribute to conduction. Hence, the intensity of interface reflection is given as a mean value of conduction electrons.

In contrast, in relation to the structure of the embodiment of the invention, as a result of provision of a hot electron generation unit H in the manner shown in FIG. 1, the traveling direction of electrons (hot electrons) can be aligned to the direction perpendicular to the interface. As a result, the spin dependency of interface reflection can be increased.

Figure 4:
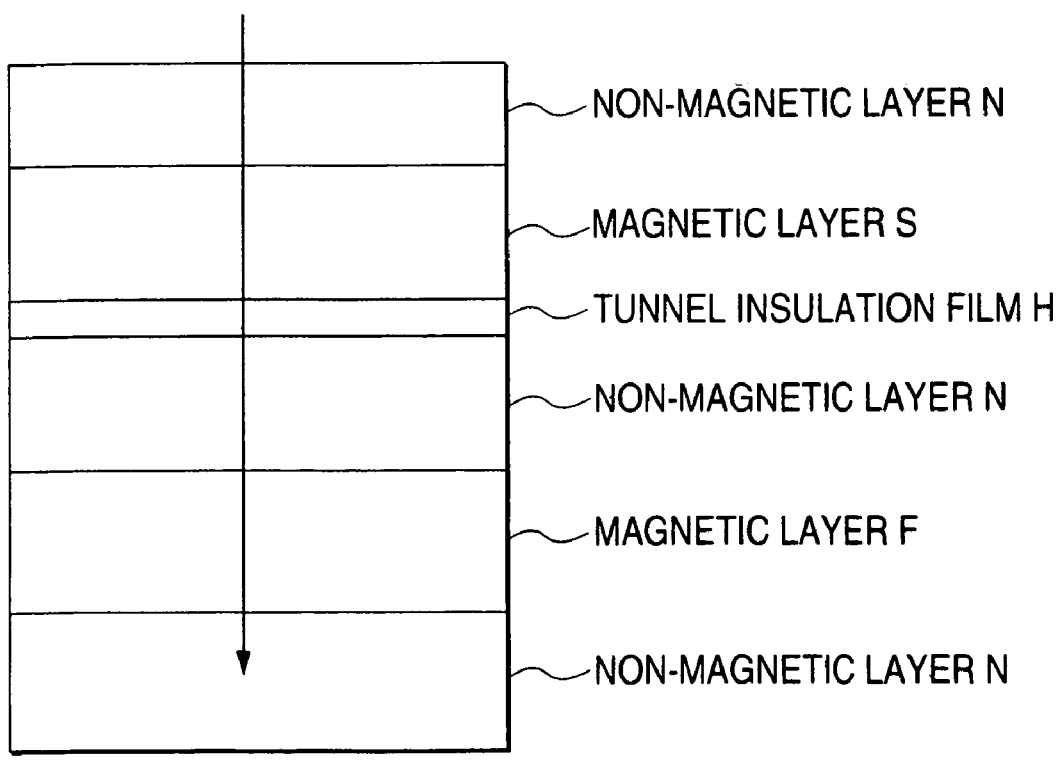
FIG. 4 is a schematic cross-sectional view showing an example further embodying the structure shown in FIG. 1.

FIG. 4 is a schematic cross-sectional view showing an example further embodying the structure shown in FIG. 1. The specific example has a structure in which there are stacked, in this order, the non-magnetic layer N, the magnetic layer (a spin polarization unit) S, a tunnel insulation film (a hot electron generation unit) H, the non-magnetic layer N, the magnetic layer F, and the non-magnetic layer N.

The magnetic layer S is a thick magnetic layer possessing coercive force. The orientation of magnetization M of the magnetic layer is fixed. The magnetic layer S plays the role of spin-polarizing current electrons. The tunnel insulation film H is a thin insulation film. As a result of the write current having passed through the film by means of tunnel rings, hot electrons are generated. The magnetic layer F is a thin magnetic layer-possessing small coercive force.

The electric current of electrons is spin-polarized by means of the magnetic layer S. As a result of the electric current having passed through the tunnel insulation film H, hot electrons are generated. The magnetization M can be rotated as a result of the current flowing through the magnetic layer F.

Figure 5A:
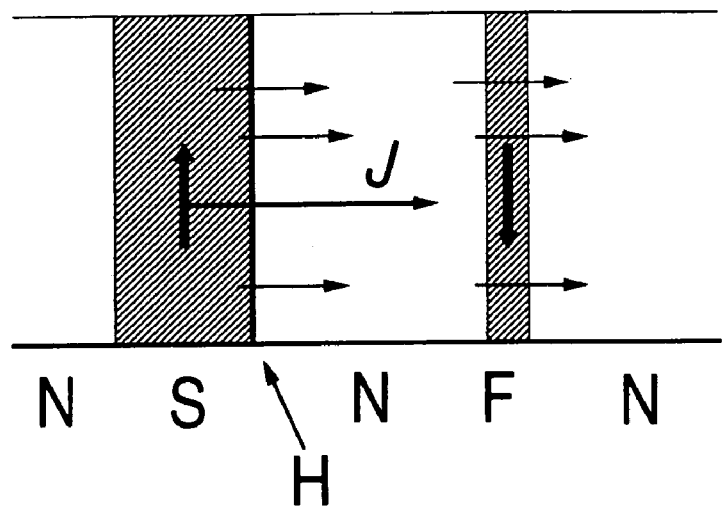
FIG. 5A is a conceptual cross-sectional view representing the flow of electrons in the specific example shown in FIG. 4.
Figure 5B:
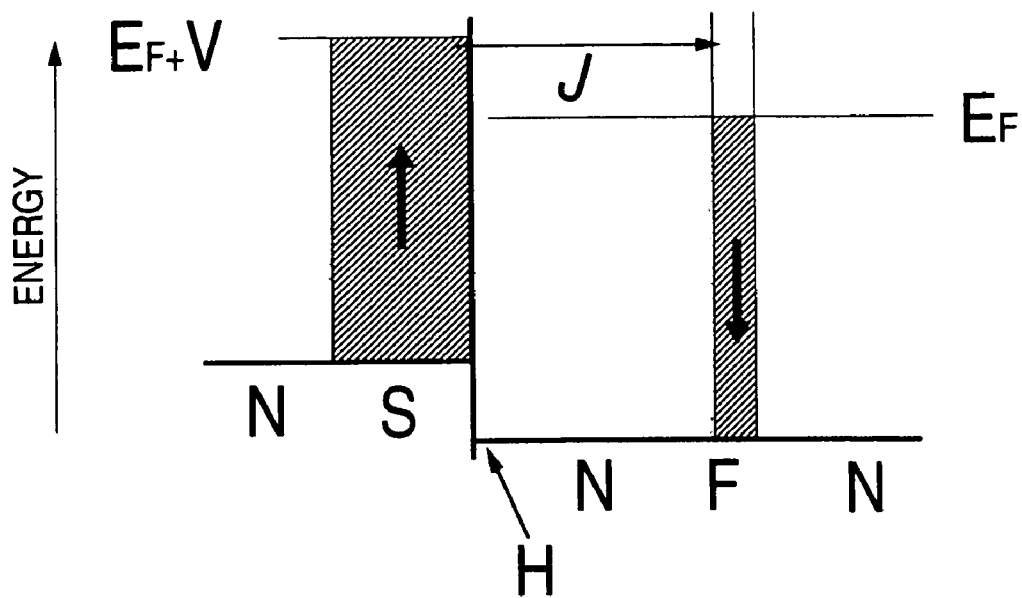
FIG. 5B is an energy diagram achieved when a write current is caused to flow by application of a voltage V to the structure of the specific example.

FIG. 5A is a conceptual cross-sectional view representing the flow of electrons in the specific example shown in FIG. 4. FIG. 5B is an energy diagram that is applicable when a write current is caused to flow by application of a voltage V to the structure of the specific example.

As a result of application of the voltage V, the electrons that tunnel through the tunnel insulation film H enter a state in which their energies are higher than the Fermi energy $E_F$ by (V); that is, the electrons become hot electrons. By means of generation of such hot electrons, the kinetic energy of electrons is increased, thereby increasing the spin dependency of interface reflection.

Moreover, the transmissivity of electrons passing through the tunnel insulation film H is higher than that of electrons which pass through the tunnel insulation film H obliquely. Hence, the electrons that have passed through the tunnel film (i.e., hot electrons) travel in a direction substantially perpendicular to the surface of the tunnel insulation film H and enter in the direction perpendicular to the interface between the non-magnetic layer N and the magnetic layer F. Consequently, the spin dependency of interface reflection can be increased.

The energy of electrons is increased by provision of the tunnel insulation film H and application of an appropriate voltage. The traveling direction of the electrons can be aligned to the direction perpendicular to the interface. Consequently, the spin dependency of interface reflection can be increased, and magnetization reversal of the magnetic layer F can be induced by means of injection of a small quantity of electric current.

In the embodiment, the spin polarization rate of electrons can be improved by generation of hot electrons. Specifically, in the case of normal conduction electrons which are not hot electrons, the spin polarization rate is determined by the material of a conductor. For instance, in the case of iron (Fe), the spin polarization rate is about 40%. In the case of cobalt (Co), a spin polarization rate of about 35% is obtained. In the case of nickel (Ni), a spin polarization rate of about 23% is obtained.

In the case of hot electrons, a spin polarization rate—which is much higher than that unique to the material of the magnetic layer—can be achieved by utilization of a "spin-flip phenomenon." For instance, when the hot electrons are caused to pass through the magnetic layer (a spin polarization unit) S of appropriate thickness, an electric current that has been spin-polarized by about 10% can also be achieved by means of the spin-flip phenomenon. Consequently, the electric current that has been spin-polarized about 100% can be injected into the magnetic layer F. Hence, in contrast with the case of the structure exemplified in FIG. 3, the magnetization of the magnetic layer F can be reversed with a considerably small write current.

The tunnel insulation film H used in the invention may be an insulation film which enables a write current to tunnel through the insulation film in the thickness wise direction thereof upon receipt of an applied predetermined voltage. The tunnel insulation film does not need to be a thin film which is completely uniform and continuous.

So-called point contacts can also be employed as a hot electron generation unit H.

Figure 6:
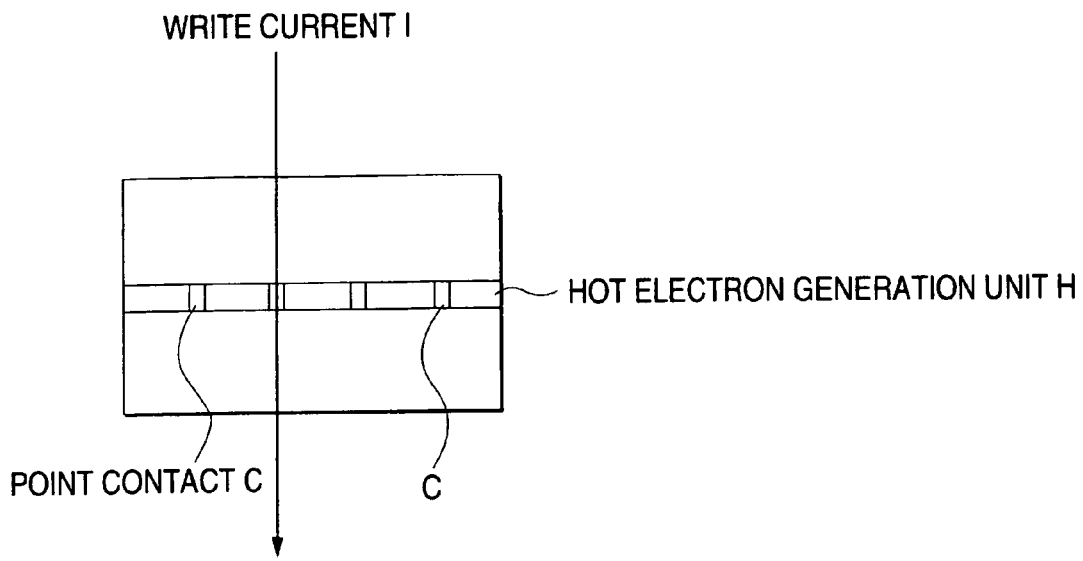
FIG. 6 is a schematic cross-sectional view illustrating a hot electron generation unit having point contacts.

FIG. 6 is a schematic cross-sectional view illustrating a hot electron generation unit having point contacts. In the case of the present embodiment, minute pores are opened in the insulation film. Conductor layers provided on both sides of the insulation film are connected together through the pores, thereby forming point contacts C. Hot electrons are generated by means of causing the write current to flow through the insulation film by way of these point contacts C, whereupon electrons which travel in a direction perpendicular to the film surface can be injected into the magnetic layer.

Such point contacts enable formation of minute apertures (0-dimensional pores) and fine lines (i.e., one-dimensional pores) in the thin dielectric substance through use of a narrow-diameter electron beam. The point contacts can be formed by formation of metal (or semiconductor) in the pores. An aperture diameter (a width in the case of a one-dimensional pore) achieved at that time is set to a value of, e.g., about five angstroms. Such a structure enables an increase in resistance as compared with that provided by a wider pore. Upon application of several volts or less, e.g., one volt to the pores, the energy state of electrons which passes through the pores can be brought into a quantization state, thereby generating hot electrons.

Point contacts of two-dimensional structure and a method for generating the point contacts shown in FIG. 6 and material to be used for generating the point contacts are referred in the "E. B. Myers et al. Current-Induced Switching of Domains in Magnetic Multilayer Devices, SCIENCE VOL. 285 6, Aug., 1999" which is previously described. As mentioned previously, a great difference between the point contacts and point contacts shown in FIG. 6 is the pore size.

A so-called "Schottky junction" can also be used as the hot electron generation unit H.

Figure 7:
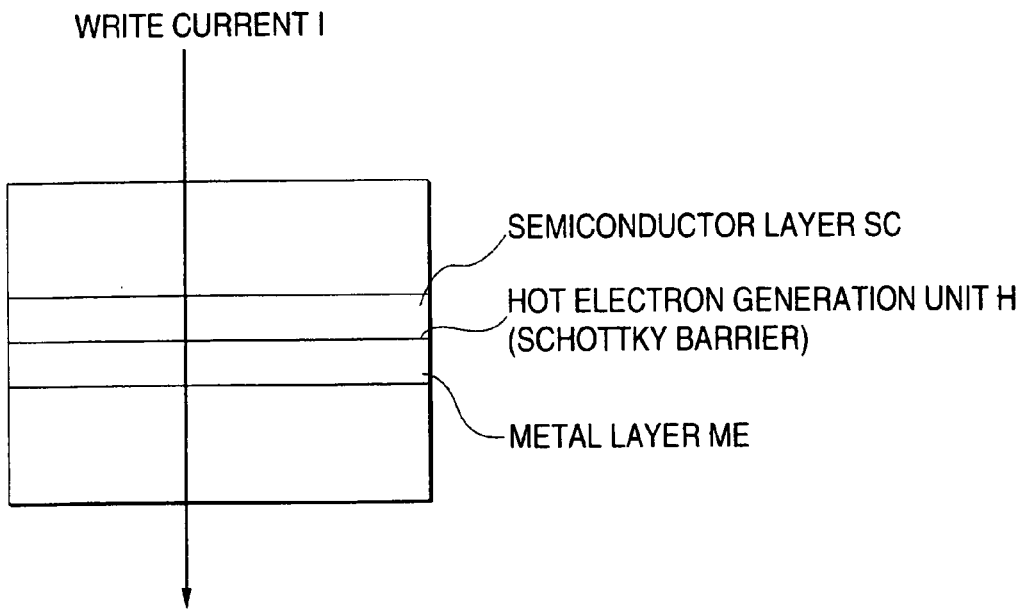
FIG. 7 is a schematic cross-sectional view illustrating a hot electron generation unit having a Schottky junction.

FIG. 7 is a schematic cross-sectional view illustrating a hot electron generation unit having a Schottky junction. In the case of this embodiment, a semiconductor layer SC comes into contact with a metal layer ME, where upon a Schottky junction is formed at that contact section. Such a Schottky junction has a predetermined Schottky barrier. Hence, a write current is caused to pass through the Schottky junction by application of a predetermined voltage, whereby hot electrons which tunnel through the Schottky barrier are obtained.

Up to this point, the structure and operation of the hot electron generation unit H of the invention have been described.

The working-effect of crystal orientation in the magnetic memory of the invention will now be described. Specifically, the invention enables further efficient spin injection by orienting crystal orientations of respective layers constituting the magnetic memory in a predetermined direction.

For instance, in the case of a specific embodiment shown in FIGS. 4, 5A and 5B, when a crystal orientation of the magnetic layer S, that of the non-magnetic layer N, and that of the magnetic layer F are oriented in a predetermined direction, electrons can be caused to run in a specific crystal orientation. A detailed explanation is given of a case where iron (Fe) is used for the magnetic layers S and F and gold (Au) is used for the non-magnetic layer N.

Figure 8A:
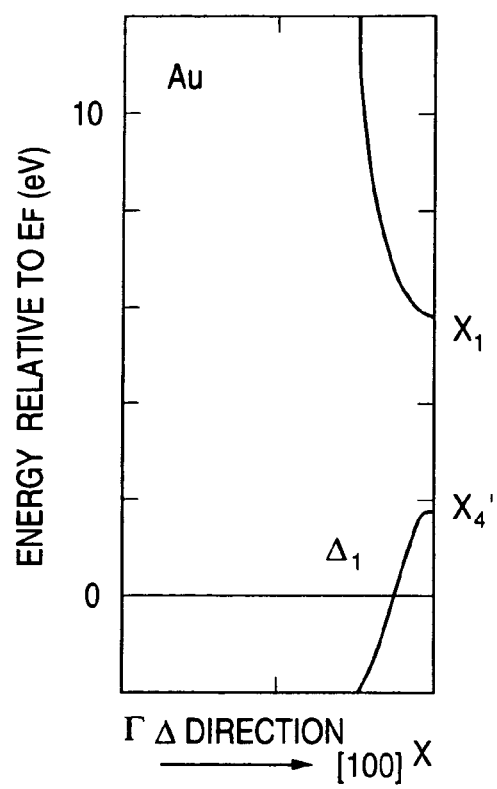
FIGS. 8A and 8B are graphs showing energy bands of electrons traveling in a [100] direction within gold (Au) and iron (Fe)
Figure 8B:
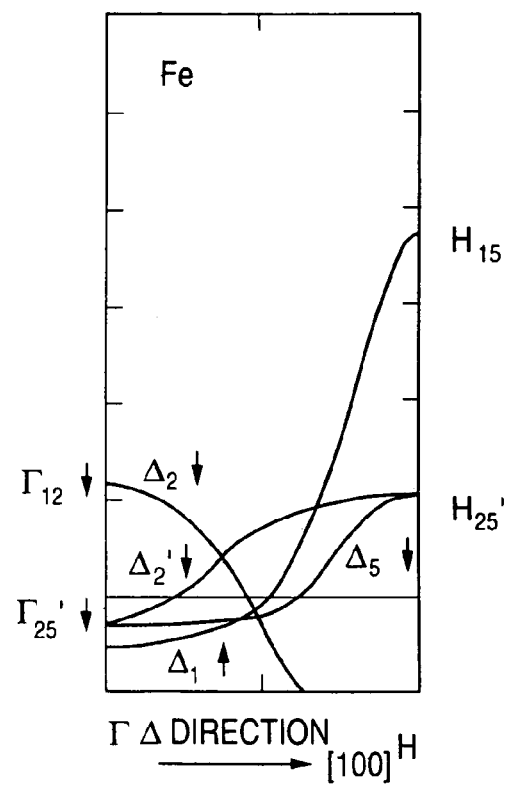

FIGS. 8A and 8B are graphs showing energy bands of electrons which travel through gold (Au) and iron (Fe) in a crystalline direction [100]. Here, the vertical axes show the energy of electrons, and the horizontal axes show frequencies of electrons along a $\Delta$ line of the Brillouin zone.

Here, the band structure is usually expressed in a frequency space called a "Brillouin zone." The states of electrons which travel in crystals of Fe and Au in a [100] orientation are expressed as dots on the $\Delta$ line in the Brillouin zone. The states of electrons are distinguished from each other according to symmetry of a wave function. In ordinary cases, the states are described by symbols such as $\Delta_1$ and $\Delta_2$ through use of an irreducible representation of a group theory. The point of origin of the Brillouin zone is called a $\Gamma$ (gamma) point. The state of the $\Gamma$ point is described as $\Gamma_{12}$, $\Gamma_{25}$ through use of the group theory.

As shown in FIG. 8A, the band of the electrons which travel through Au in the [100] direction has a $\Delta_1$ symmetry in the vicinity of the Fermi level. As shown in FIG. 8B, the band of Fe is complicated. An up-spin band possesses the $\Delta_i$ symmetry at a higher location of the Fermi level. A down-spin band possesses $\Delta_2$, $\Delta_{2'}$, and $\Delta_5$ symmetries. Electrons can travel between bands having the same symmetry without undergoing reflection. Up-spin electrons which travel in the [100] direction and have an energy level higher than the Fermi level can pass through the interface between Au and Fe.

Electrons cannot travel between bands possessing different symmetries. Hence, down-spin electrons which travel in the [100] direction undergo intensive reflection at the interface between Au and Fe.

Specifically, the non-magnetic layer N is formed from Au, and the magnetic layers S and F are formed from Fe. Crystals of the magnetic layers are oriented, to thereby cause the write current to flow in the [100] direction. As a result, at the interface between Au and Fe a great difference arises between the reflectivity of the up-spin electrons and that of the down-spin electrons. Specifically, interface reflection having intensive spin dependency arises. As described in connection with FIGS. 1 through 5B, the greater the spin dependency of electron reflectivity at the interface, the greater the rotating force that acts on the magnetization M of the magnetic layer F. Accordingly, as a result of the materials of the respective layers being selected and crystals of the materials being oriented, great rotational force can be exerted on the magnetization M of the magnetic layer F. Further, magnetization can be reversed by means of the write current.

The same effect can be yielded even when, e.g., silver (Ag), platinum (Pt), copper (Cu), or aluminum (Al) is used as a material of the non-magnetic layer N in place of Au.

The down-spin electrons can pass through the interface between chromium (Cr) and iron (Fe) at a higher Fermi level. However, the up-spin electrons are reflected intensively. In this case, the transmissivity of the up-spin electrons and that of the down-spin electrons are opposite those obtained at the interface between Au and Fe. Still, interface reflection having high dependency on spin can also be achieved.

Manganese (Mn) also has a band structure analogous to that of chromium (Cr). Hence, the same effect can be yielded even when Mn is used in place of Cr.

EXAMPLES

The invention will now be described in detail by reference to examples.

First Example

Figure 9:
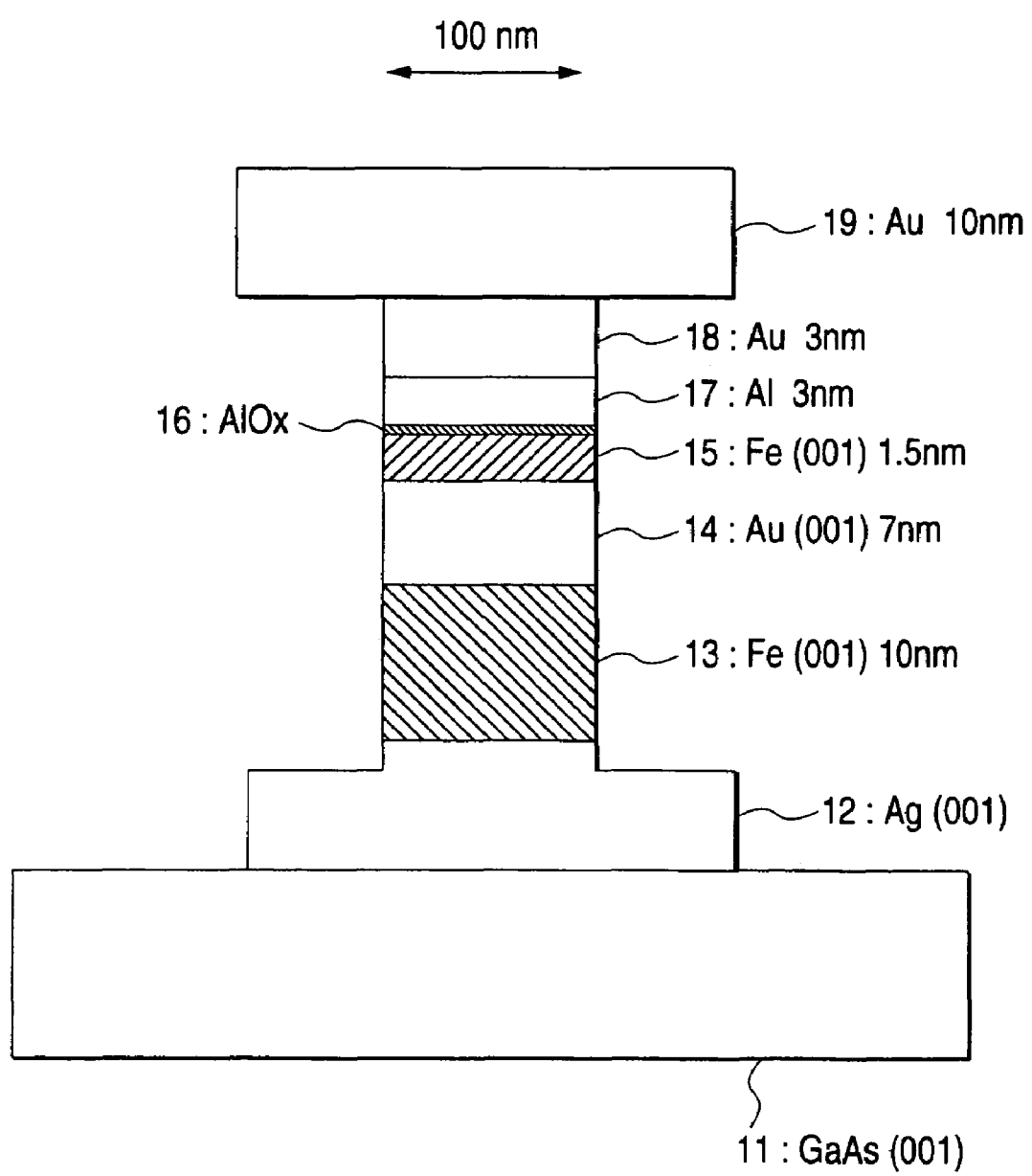
FIG. 9 is a schematic cross-sectional view showing a portion of magnetic memory of the example.

FIG. 9 is a schematic cross-sectional view showing a portion of magnetic memory of a first example. The structure of the memory will be described hereinbelow according to manufacturing procedures.

Samples were prepared by use of a multi-chamber molecular beam epitaxy (MBE) system. An ultimate vacuum is about $1 \times 10^{-8}$ pascals.

First, after a non-doped GaAs (001) substrate 11 had been heated to 350° C. in a first chamber to remove an oxide surface film, an Ag (001) orientation film having a thickness of 100 nanometers was formed, and the thus-formed film was taken as a lower electrode 12. Then, an Fe film (having a thickness of 10 nanometers) 13, an Au film (having a thickness of 7 nanometers) 14, an Fe film (having a thickness of 1.5 nanometers) 15, and an Al film (having a thickness of 0.1 nanometers), all being oriented in the [001] orientation, were formed on the lower electrode 12 through epitaxial growth.

Next, the multilayer film was introduced into a second chamber of the MBE, and the top Al layer was naturally oxidized in pure oxygen of about $10^{-1}$ pascals, thereby forming an AlOx insulation film 16.

The multilayer film was again returned to the first chamber of the MBE, whereby an Al film (having a thickness of 10 nanometers) 17 and an Au film (having a thickness of 50 nanometers) 18 were stacked on the insulation film 16. The Fe layers 13 and 15 in the multilayer film are in a magnetically-nonbonded state. Both multilayer films show uniaxial anisotropy while the [110] orientation is taken as a magnetization easy axis.

This multilayer film was processed into a columnar structure having a diameter of 100 nanometers through use of electron beam lithography and ion milling techniques.

Finally, the multilayer film was smoothed by means of polyimide. An upper electrode Au (having a thickness of 100 nanometers) was formed by means of photolithography and reactive ion etching techniques, whereby the structure shown in FIG. 9 was completed.

Magnetization reversal and measurement thereof were performed by detecting a current-perpendicular-to-plane magnetoresistance effect (CPP-MR) of pillar structure. Specifically, an electric current was caused to flow between the upper and lower electrodes 11, 19, thereby measuring a variation in resistance developing between the upper and lower electrodes in association with magnetization reversal of the lower Fe layer 13.

First, a magnetic field of 1000 Oe (oersted) was applied in the [110] direction in a plane, thereby recovering a magnetic field of 0 Oe. The upper and lower Fe layers 13, 15 possess coercive force of 100 Oe or thereabouts. Hence, in this state, magnetization of the upper Fe layer 13 and that of the lower Fe layer 15 remain parallel to each other. A variation in resistance was obtained by measuring a variation in differential resistance dV/dI through use of a lock-in amplifier.

Figure 10:
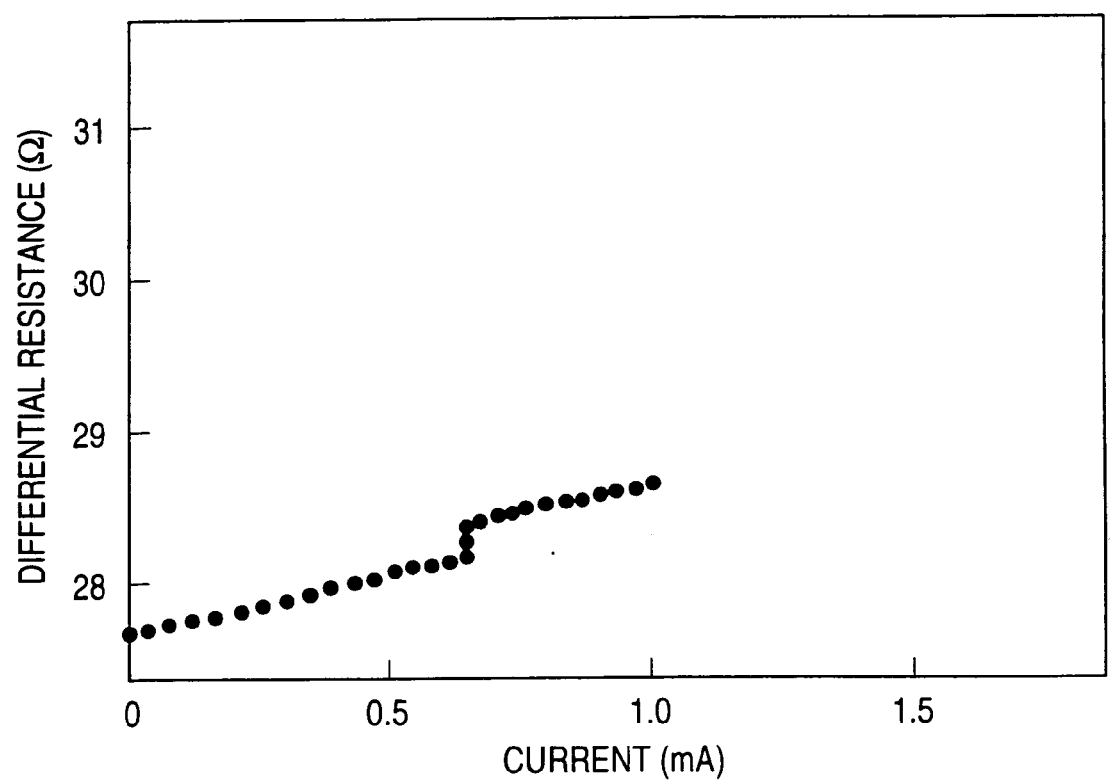
FIG. 10 is a graph showing variations in differential resistance to an electric current.

FIG. 10 is a graph showing variations in differential resistance to an electric current. When the lower electrode is switched to positive and an electric current is gradually increased, a stepwise rise in differential resistance was observed at about 0.7 mA. This step shows an increase in magnetic resistance stemming from magnetization reversal of the thin Fe layer 15 into a magnetization reversal parallel state from the state in which magnetization of the Fe layer 13 and that of the Fe layer 15 are parallel to each other. The electric current of 0.7 mA required to effect magnetization reversal of the Fe layer 15 is converted into a current density of about $1-10^7$ A/cm$^2$.

Comparative Example

A structure analogous to that shown in FIG. 9 with the exception of the AlOx insulation film 16 not being provided was produced as a comparative example of the first embodiment by means of the MBE, the electron beam lithography, and the photolithography techniques.

Magnetization reversal of the element of this comparative example was observed according to the same method as that employed in the first example, thus determining an electric current and current density required to effect magnetization reversal. As a result, a current required to effect magnetization reversal was determined to be 10.4 mA, and the current density was determined to be about $1.4 \times 10^8$ A/cm$^2$.

Namely, the element of the first example is found to enable magnetization reversal at a write current of one-tenth or less that required in the comparative example.

Second Example

Figure 11:
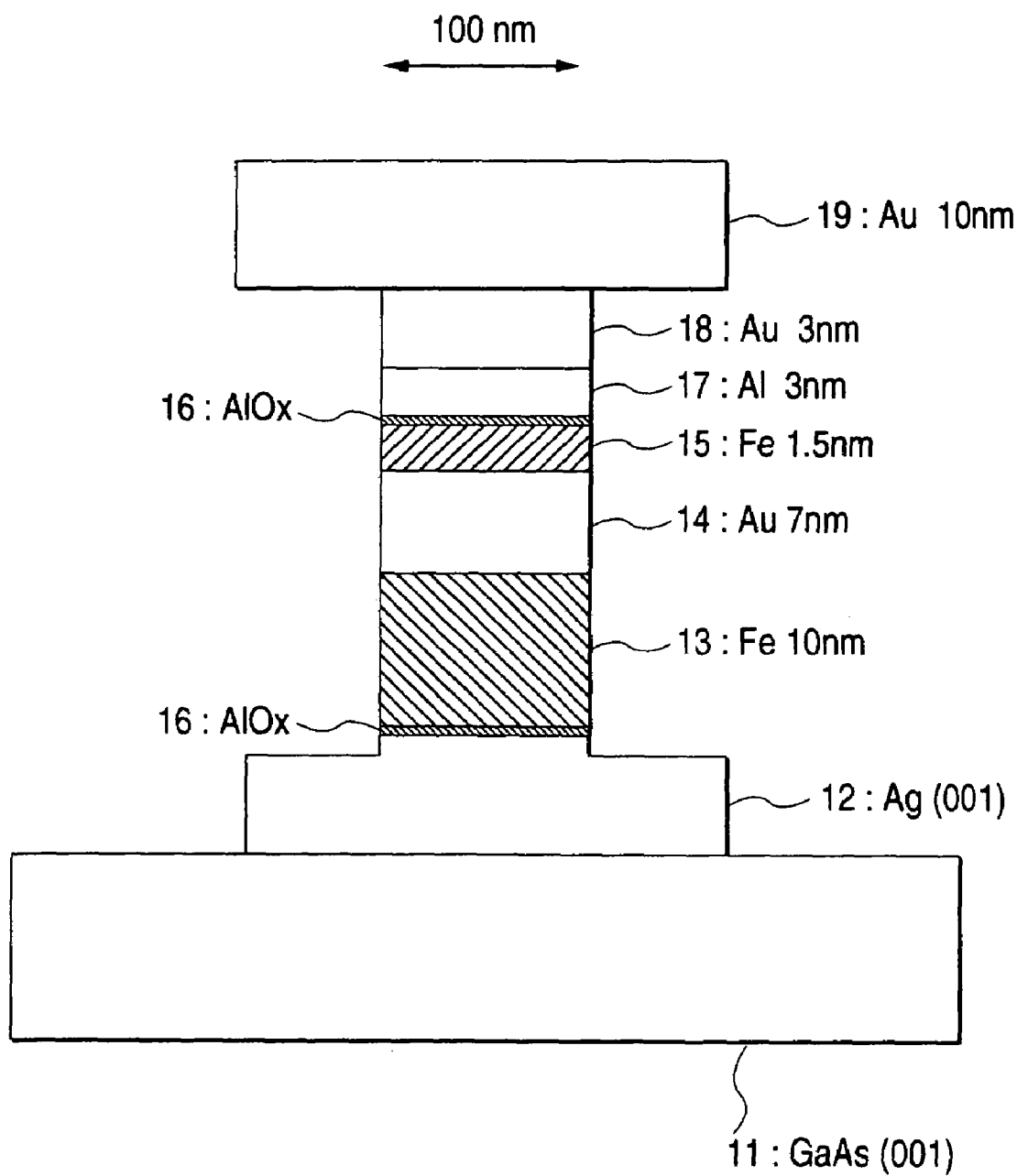
FIG. 11 is a schematic cross-sectional view showing a portion of magnetic memory according to a second example of the invention.

FIG. 11 is a schematic cross-sectional view showing a portion of magnetic memory according to a second example of the invention. A difference between the structure of the second example and that shown in FIG. 9 lies in that the AlOx insulation film 16 is interposed also between the lower electrode (Ag) 12 and a lower side of the Fe layer 13.

Figure 12:
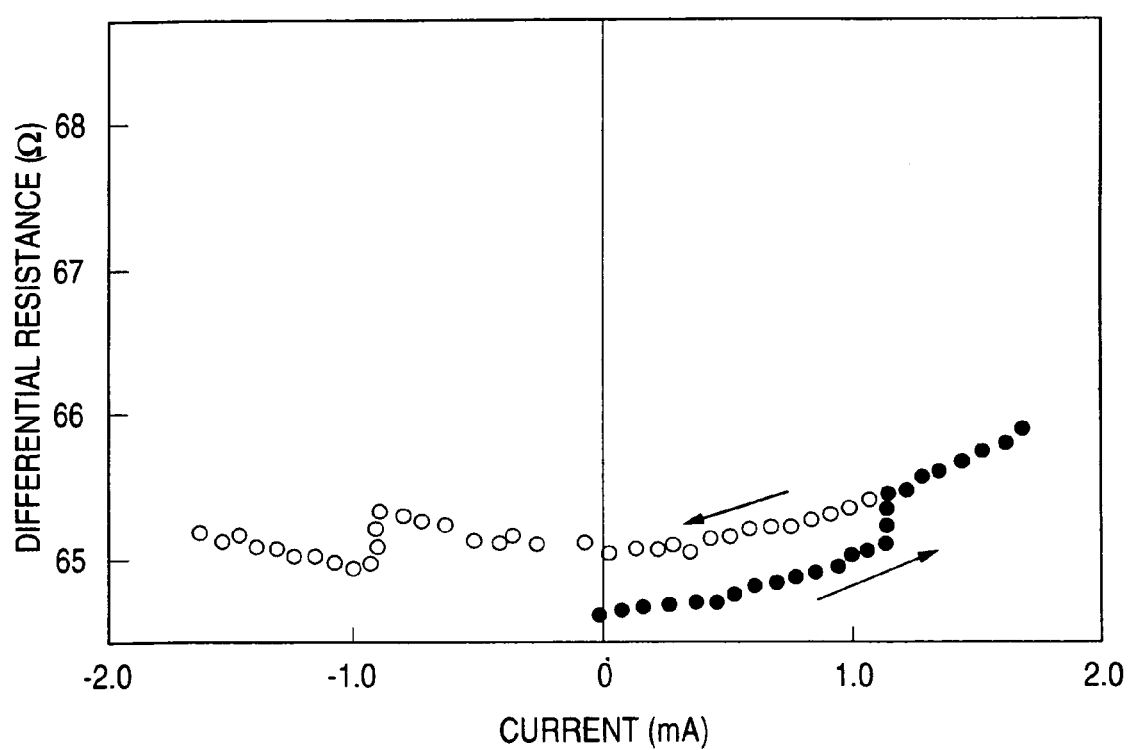
FIG. 12 is a graph showing a result of measurement of a change in the differential resistance dV/dI by changing the direction of an electric current in both positive and negative directions in connection with magnetic memory of the second example of the invention.

In relation to the structure of the present example, a variation in the differential resistance dV/dI was measured by changing the direction of the electric current in both positive and negative directions, whereby results shown in FIG. 12 were obtained.

First, when an electric current was caused to flow in a positive direction (i.e., a direction in which the lower electrode 12 assumes a positive voltage), a stepwise increase in differential resistance was observed to arise at about 1.2 mA. Specifically, magnetization of the upper thin Fe layer 15 was reversed at 1.2 mA, and magnetization of the upper layer 13 and that of the lower layer 15 changed from a parallel state to a reverse parallel state. Subsequently, even when the electric current was caused to decrease and return to 0 (zero), the reverse parallel state remained. However, when the electric current was increased to a negative direction, a stepwise decrease was observed to arise in differential resistance at about 0.9 mA. Magnetization of the Fe layer 13 and that of the Fe layer 15 were acknowledged to have returned to a parallel state.

Third Example

Figure 13:
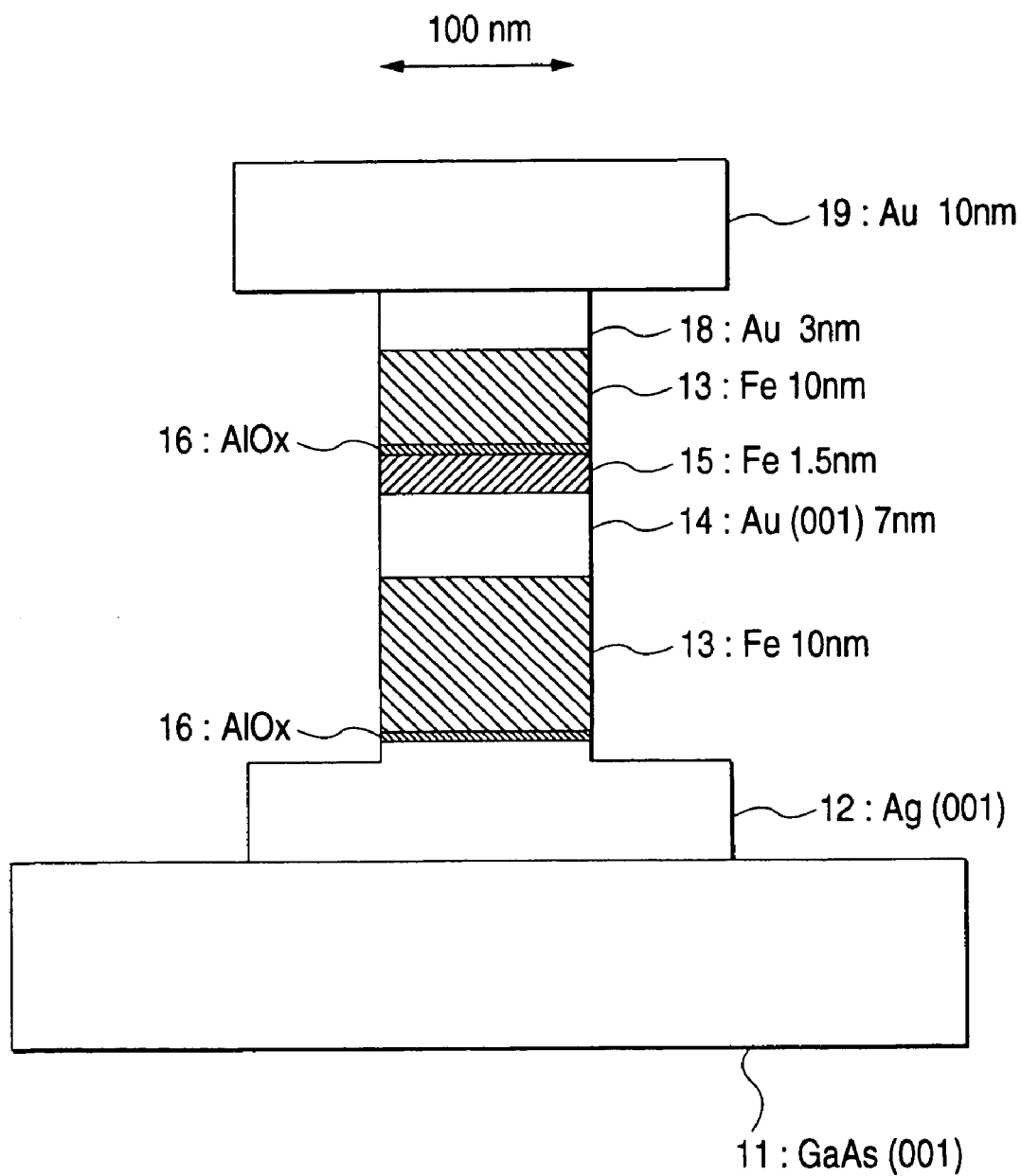
FIG. 13 is a schematic cross-sectional view showing a portion of magnetic memory according to a third embodiment of the invention.

FIG. 13 is a schematic cross-sectional view showing a portion of magnetic memory according to a third example of the invention.

Specifically, the magnetic memory of the example has a two-layer insulation film 16, as in the case of the second example. In the example, the thick Fe layer (having a thickness of 10 nanometers) 13 was formed on the thin Fe layer 15 by way of the dielectric layer 16 in lieu of the Al layer 17. The Fe layer 15, the dielectric layer 16, and the upper Fe layer 13 constitute a so-called "magnetic tunnel junction."

Even in this example, the direction of the current was changed in both positive and negative directions, thereby measuring a variation in the differential resistance dV/dI, as in the case of the second example. When the electric current was caused to flow in the positive direction (i.e., the lower electrode 12 assumes a positive voltage), a stepwise increase in the differential resistance was observed to arise at about 1.0 mA. Specifically, magnetization of the thin Fe layer (1.5 nm) 15 reversed to become reverse parallel to magnetization of the upper thick Fe layer (10 nm) 13 and magnetization of the lower thick Fe layer (10 nm) 13. Subsequently, even when the current has been decreased and returned to zero, the reverse parallel state remains. The electric current was increased in a negative direction, a stepwise decrease in differential resistance was observed to a rise at about 1.4 mA. Magnetization of the Fe layer 13, that of the Fe layer 15, and that of the Fe layer 13 were ascertained to have returned to a parallel state.

Fourth Example

Figure 14:
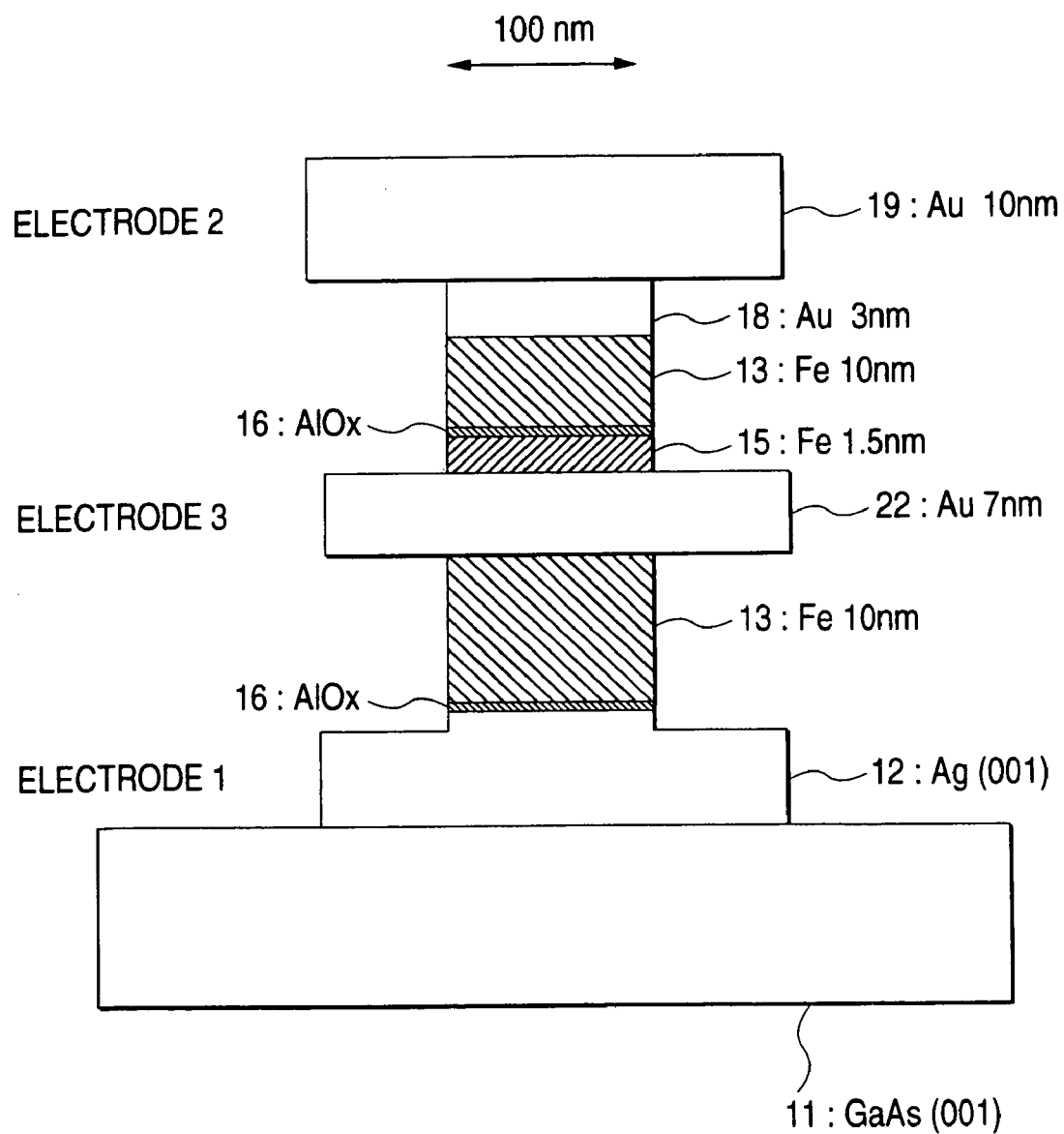
FIG. 14 is a schematic cross-sectional view showing a portion of magnetic memory according to a fourth example of the invention.

FIG. 14 is a schematic cross-sectional view showing a portion of magnetic memory according to a fourth example of the invention.

Specifically, the magnetic memory of the example also has the two-layer insulation film 16, as in the case of the second and third examples. In this example, the thick Fe layers 13, 13 were provided on the upper and lower sides of the thin Fe layer 15, as in the case of the third example. In the present example, an Au layer 22 interposed between the lower Fe layer 13 and the thin Fe layer 15 is taken as a third electrode, thereby forming a so-called "three-terminal type" structure.

The electric currents of positive and negative directions were caused to flow between electrodes 1 and 2. Magnetization reversal of the thin Fe layer 15 was observed by measuring differential resistance in the magnetic tunnel junction between the electrodes 2, 3. When the electric current is caused to flow in the positive direction between the electrodes 1, 2, magnetization reversal arises at about 1.0 mA, as in the case of the third example. Magnetization of a tunnel junction changes to a reverse parallel state. When the electric current was caused to flow in the negative direction successively, the magnetization of the tunnel junction was observed to return to a parallel state at about 1.6 mA.

Fifth Example

Next, a specific example of magnetic memory having the previously-described spin-injection-type write structure will be described as a fifth example of the invention. Magnetic memory, such as magnetic random access memory having memory cells arranged in a matrix pattern, can be embodied through use of the spin injection structure described in connection with FIGS. 1 through 14.

Figure 15:
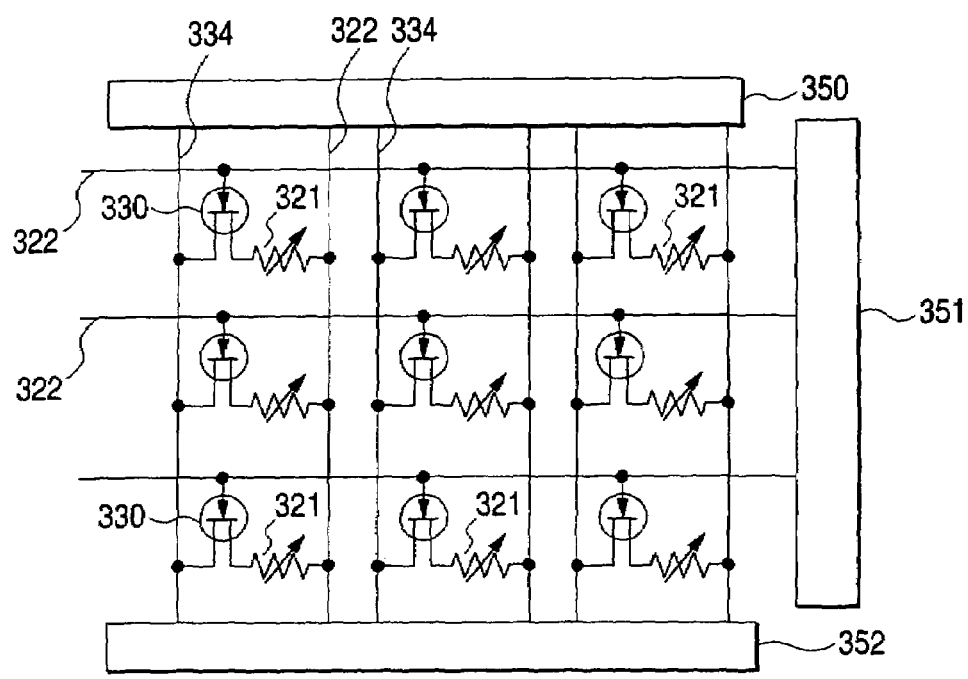
FIG. 15 is a conceptual rendering illustrating a matrix configuration of the magnetic memory of the example.

FIG. 15 is a conceptual rendering illustrating a matrix configuration of the magnetic memory of the example.

The drawing shows a circuit configuration of the example in which memory cells are arranged in an array pattern. In order to select one bit in the array, a column decoder 350 and a row decoder 351 are provided. Switching transistors 330 are activated and uniquely selected by means of bit lines 334 and word lines 322. The thus-selected switching transistors are detected by means of a sense amplifier 352, thereby reading bit information recorded on a magnetic recording layer constituting a magnetoresistance effect element 321.

As mentioned previously in connection with FIGS. 1 through 14, the magnetoresistance effect element 321 has the spin polarization unit S and the hot electron generation unit H. Magnetization of the magnetic layers is reversed by means of the spin-polarized hot electrons, thereby enabling writing operation.

At the time of writing of bit information, a predetermined switching transistor 330 is activated by means of a predetermined bit line 334 and the word line 322. The write electric current is caused to flow into the magnetoresistance effect element 321 connected to that transistor.

Figure 16:
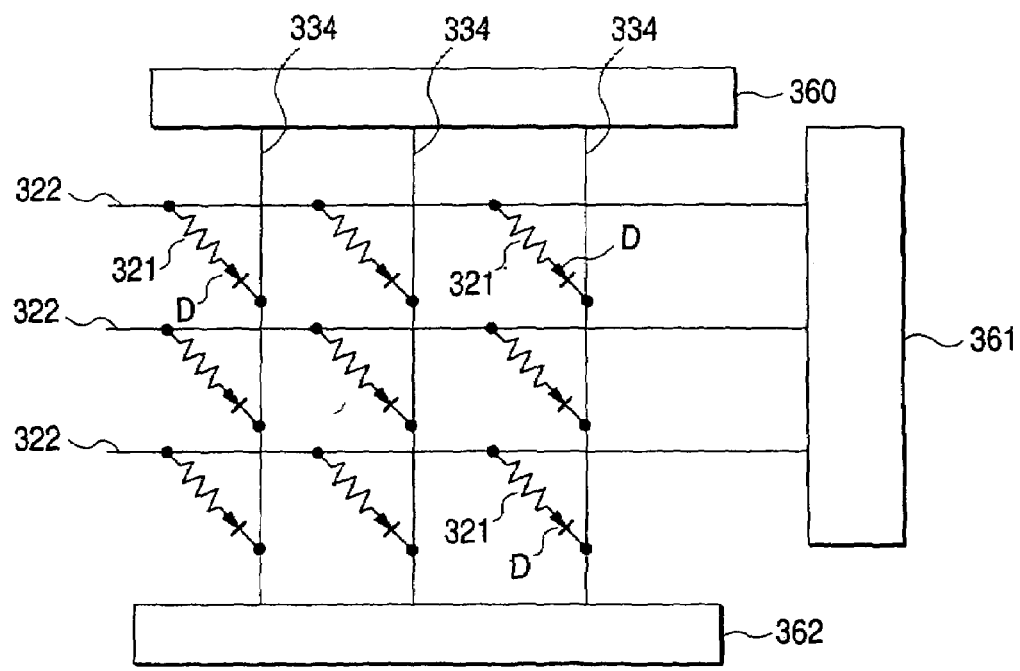
FIG. 16 is a conceptual rendering showing another specific example of the matrix configuration of the magnetic memory of the example.

FIG. 16 is a conceptual rendering showing another specific example of the matrix configuration of the magnetic memory of the example. Specifically, in the case of the present example, the bit lines 322 and the word lines 334 arranged in a matrix pattern are selected by means of the decoders 360, 361, thereby selecting specific memory cells in the array. Each of the memory cells has a structure in which the magnetoresistance effect element 321 and a diode D are connected in series with each other. Here, the diode D plays the role of preventing diversion of the sense current and the write current to memory cells other than the selected magnetoresistance effect element 321.

Figure 17:
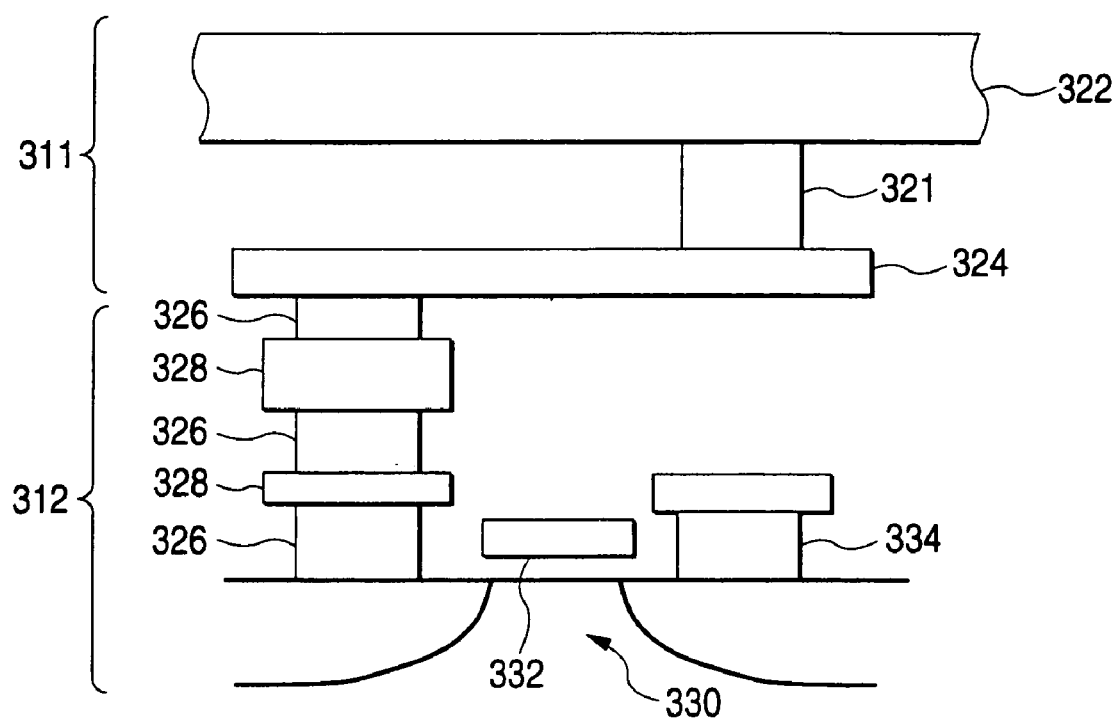
FIG. 17 is a conceptual rendering showing a cross-sectional structure of the principal section of the magnetic memory according to the example of the invention.

FIG. 17 is a conceptual rendering showing a cross-sectional structure of the principal section of the magnetic memory according to the example of the invention.

The structure illustrated in the drawing corresponds to one memory cell contained in the magnetic memory shown in FIG. 15. In other words, the structure is a memory cell for one. bit of the magnetic memory which operates as random access memory. The memory cell has a storage element section 311 and an address selection transistor section 312.

The storage element section 311 has the magnetoresistance effect element 321 and a pair of wires 322, 324 connected thereto. As described in connection with FIGS. 1 through 14, the magnetoresistance effect element 321 has the hot electron generation unit H and the spin polarization unit S. Writing operation can be performed by reversing magnetization of the magnetic layer through use of spin-polarized hot electrons.

The selection transistor section 312 has a transistor 330 connected thereto by way of a via 326 and an embedded wire 328. The transistor 330 performs switching operation in accordance with a voltage applied to a gate 332, thereby controlling opening and closing of the current path between the magnetoresistance effect element 321 and the wire 334.

When bit information is read, a sense current is caused to flow by way of the wire 322, the magnetoresistance effect element 321 including a magnetic recording layer, and a lower electrode 324, and the resistance or variation in resistance of the magnetoresistance effect element 321 is measured.

When bit information is written, a write current is caused to flow by way of the wire 322, the magnetoresistance effect element 321 including a magnetic recording layer, and the lower electrode 324, in the same manner, and magnetization of the magnetic recording layer (magnetic layer F) is reversed as appropriate.

As a result of spin injection writing being performed by means of hot electrons as mentioned in connection with FIGS. 1 through 14, the write current can be reduced significantly. Consequently, the power consumed by the memory is diminished, and commercialization of the magnetic memory having a high density becomes feasible.

The invention has been described by reference to specific examples. However, the invention is not limited to these specific examples. For instance, a person skilled in the art can adopt the structure of the spin bulb film employed in a known GMR element for a spin bulb transistor of the invention in an unmodified form or in an appropriately amended form by means of selecting appropriate ones from known ranges in connection with the specific structure of the magnetic memory, the magnetoresistance effect element constituting the structure, a specific structure of the switching element, a layout relationship and connection relationship of the switching elements, and the shapes and materials of electrodes, peripheral circuits, and insulation structures. These structures are also encompassed by the scope of the invention. The invention is implemented in the same manner, and a similar effect can be obtained.

Accordingly, the structure in which the previously-mentioned hot electron generation unit and spin polarization unit are added to the known GMR element and TMR element also falls within the scope of the invention.

In addition, all magnetic memory devices and methods for writing data into the memory devices, which can be implemented by a person skilled in the art on the basis of the magnetic memory and the writing method therefor, both being described in connection with the examples, by means of an appropriate design change, also fall within the scope of the invention.

As has been described in detail, efficiency of magnetization reversal due to spin injection is increased by use of hot electrons (hot holes) as current carriers in place of conventional conduction electrons, thereby enabling magnetization reversal of a magnetic film at a smaller current (density).

The method is applied to writing of data into an MRAM cell formed by integration of magnetic tunnel junctions, GMR elements, spin bulb transistors, and MOS transistors, thereby enabling manufacture of highly-integrated MRAM and yielding a large industrial merit.

What is claimed is:

1. A magnetic memory comprising:
   a spin polarization unit configured to spin-polarize electrons constituting a write current;
   a hot electron generation unit configured to convert the electrons into hot electrons, the hot electron generation unit comprising an insulation film and a conductive portion, the conductive portion penetrating the insulation film in a thickness direction of the insulation film; and
   a magnetic layer having a magnetization which is reversed by the hot electrons.

2. The magnetic memory according to claim 1, wherein a response characteristic of an electric current flowing as a result of application of a voltage to the hot electron generation unit is non-linear.

3. The magnetic memory according to claim 1, wherein the hot electron generation unit includes an insulation film which enables the write current to tunnel through the insulation film in a thicknesswise direction thereof upon application of a voltage.

4. The magnetic memory according to claim 1, wherein the hot electron generation unit includes two conductive layers sandwiching the insulation film, and the two conductive layers contact the conductive portion of the hot electron generation unit.

5. A magnetic memory comprising:
   a spin polarization unit configured to spin-polarize electrons constituting a write current;
   a hot electron generation unit configured to convert the electrons into hot electrons; and
   a magnetic layer having a magnetization which is reversed by the hot electrons,
   wherein the hot electron generation unit includes a Schottky junction.

6. The magnetic memory according to claims 1, further comprising:
   a magnetic layer in which a first crystal axis is aligned in a direction perpendicular to a film surface; and
   a non-magnetic layer which is stacked on the magnetic layer and in which a second crystal axis is aligned in the direction perpendicular to the film surface, wherein
   one of a symmetry of an up-spin band and a symmetry of a down-spin band, which is achieved at an energy level higher than a Fermi energy level of electrons traveling in the direction of the first crystal axis in the magnetic layer, is not present in a band of electrons located at an energy level higher than the Fermi energy level of electrons traveling in the direction of the second crystal axis in the non-magnetic layer.

7. The magnetic memory according to claims 1, wherein the spin polarization unit is a magnetic layer in which magnetization is fixed in substantially one direction.

8. A method of writing data into a magnetic memory, the magnetic memory including a hot electron generation unit, the hot electron generation unit including a conductive portion penetrating an insulating film in a thickness direction of the insulating film, the method comprising:
   spin-polarizing electrons constituting a write current;
   converting the electrons into hot electrons by causing the write current to flow through the conductive portion; and
   reversing magnetization of a magnetic layer by the hot electrons.

9. A magnetic memory comprising:
   a first electrode;
   a first magnetic layer formed above the first electrode;
   a first non-magnetic layer formed on the first magnetic layer;
   a second magnetic layer formed on the first non-magnetic layer;
   a first insulation film formed on the second magnetic layer;
   a first layer formed on the first insulation film;
   a second non-magnetic layer formed on the first layer; and
   a second electrode formed on the second non-magnetic layer.

10. The magnetic memory according to claim 9, wherein the first layer is a non-magnetic layer.

11. The magnetic memory according to claim 9, further comprising:
    a second insulation film formed between the first electrode and the first magnetic layer, wherein the first layer is a non-magnetic layer.

12. The magnetic memory according to claim 9, further comprising:
    a second insulation film formed between the first electrode and the first magnetic layer, wherein the first layer is a magnetic layer.

13. The magnetic memory according to claim 9, further comprising:
    a second insulation film formed between the first electrode and the first magnetic layer, wherein:
    the first layer is a magnetic layer; and
    the first non-magnetic layer is a third electrode.

* * * * *